United States Patent
Hachitani et al.

(10) Patent No.: US 10,302,721 B2
(45) Date of Patent: May 28, 2019

(54) MAGNETIC RESONANCE MEASUREMENT APPARATUS WITH IMPROVED INSTRUCTION SEQUENCE TRANSFER

(71) Applicant: JEOL Ltd., Tokyo (JP)

(72) Inventors: Kenichi Hachitani, Tokyo (JP); Kenya Izumi, Tokyo (JP); Yukio Nishimura, Tokyo (JP); Takayuki Suzuki, Tokyo (JP)

(73) Assignee: JEOL Ltd., Tokyo (JP)

( * ) Notice: Subject to any disclaimer, the term of this patent is extended or adjusted under 35 U.S.C. 154(b) by 839 days.

(21) Appl. No.: 14/805,796

(22) Filed: Jul. 22, 2015

(65) Prior Publication Data

US 2016/0187440 A1 Jun. 30, 2016

(30) Foreign Application Priority Data

Jul. 24, 2014 (JP) .................... 2014-150826

(51) Int. Cl.
  *G01R 33/46* (2006.01)
  *G01R 33/36* (2006.01)
  *G01R 33/54* (2006.01)

(52) U.S. Cl.
  CPC ..... *G01R 33/4608* (2013.01); *G01R 33/3614* (2013.01); *G01R 33/4625* (2013.01); *G01R 33/543* (2013.01)

(58) Field of Classification Search
  CPC ............ G01R 33/4608; G01R 33/4625; G01R 33/3614; G01R 33/543
  See application file for complete search history.

(56) References Cited

U.S. PATENT DOCUMENTS

| 4,764,894 A | 8/1988 | Codrington |
| 2005/0225325 A1 | 10/2005 | Hornung |
| 2011/0254546 A1* | 10/2011 | Ritter ................. G01R 33/5612 324/307 |

(Continued)

FOREIGN PATENT DOCUMENTS

| EP | 0287661 A1 | 10/1988 |
| JP | 2007335958 A | 12/2007 |

OTHER PUBLICATIONS

Adduci et al., "Versatile pulse programmer for nuclear magnetic resonance", Review of Scientific Instr., Nov. 1979, pp. 1403-1415, vol. 50, No. 11.

*Primary Examiner* — Huy Q Phan
*Assistant Examiner* — Zannatul Ferdous
(74) *Attorney, Agent, or Firm* — The Webb Law Firm

(57) ABSTRACT

Procedure instruction sequences ($P_1$~$P_N$) in an instruction sequence (for example, an instruction sequence for an NMR spectrometer) are generated in a precedential manner, and transferred to a procedure storage area on a transmission and reception unit in a precedential manner. After the precedential transfer, a remaining portion of the instruction sequence (streaming instruction sequence ($S_{M1}$, ... )) is sequentially generated in predetermined units from the beginning, and sequentially transferred to a FIFO area on the transmission and reception unit. A sequencer refers to the streaming instruction sequence, executes the instruction, and refers to a procedure instruction sequence on the procedure storage area.

8 Claims, 11 Drawing Sheets

(56) References Cited

U.S. PATENT DOCUMENTS

2012/0249140 A1* 10/2012 Albsmeier ......... G01R 33/3692
324/309
2014/0111199 A1* 4/2014 Oh ........................ A61B 5/11
324/309
2016/0161580 A1* 6/2016 Shirai ................... A61B 5/055
324/322

* cited by examiner

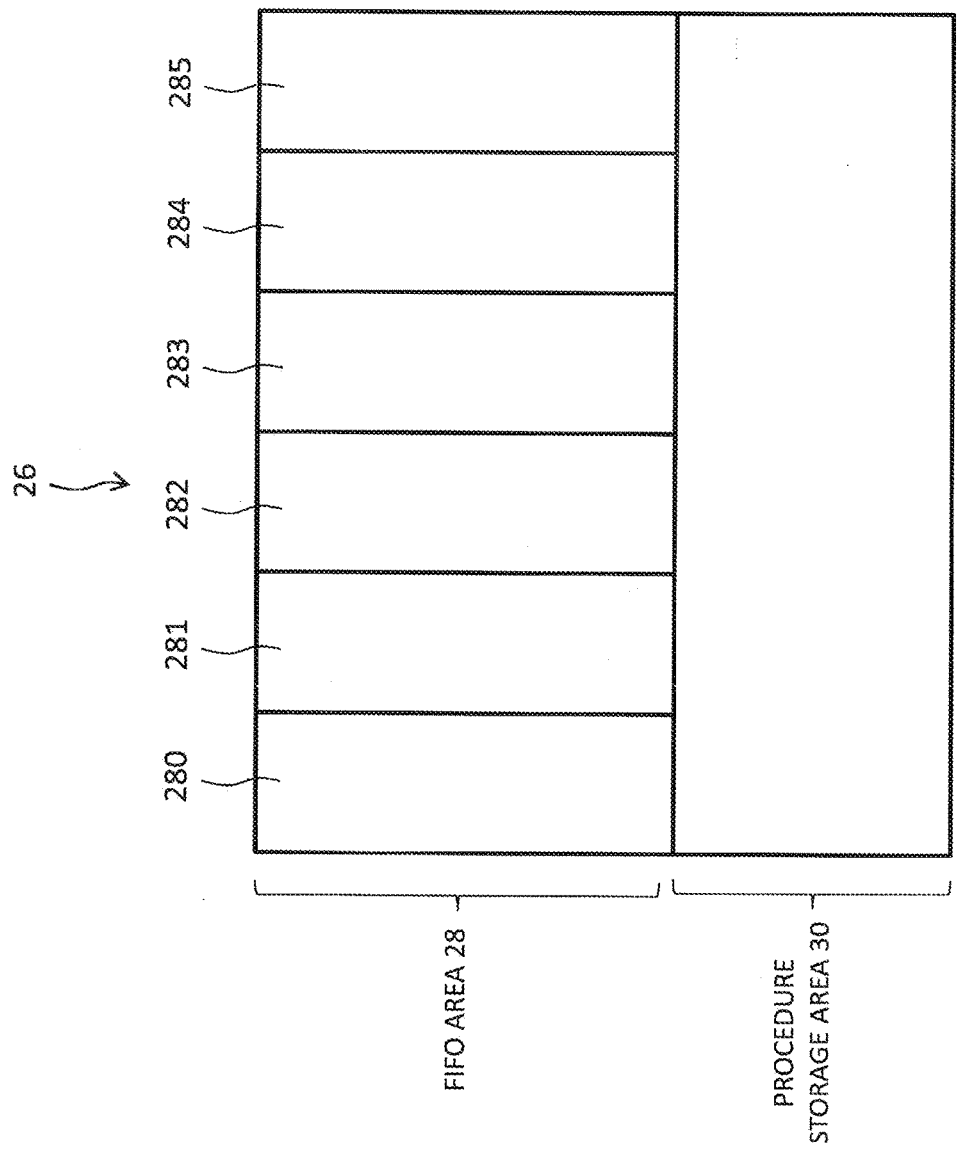

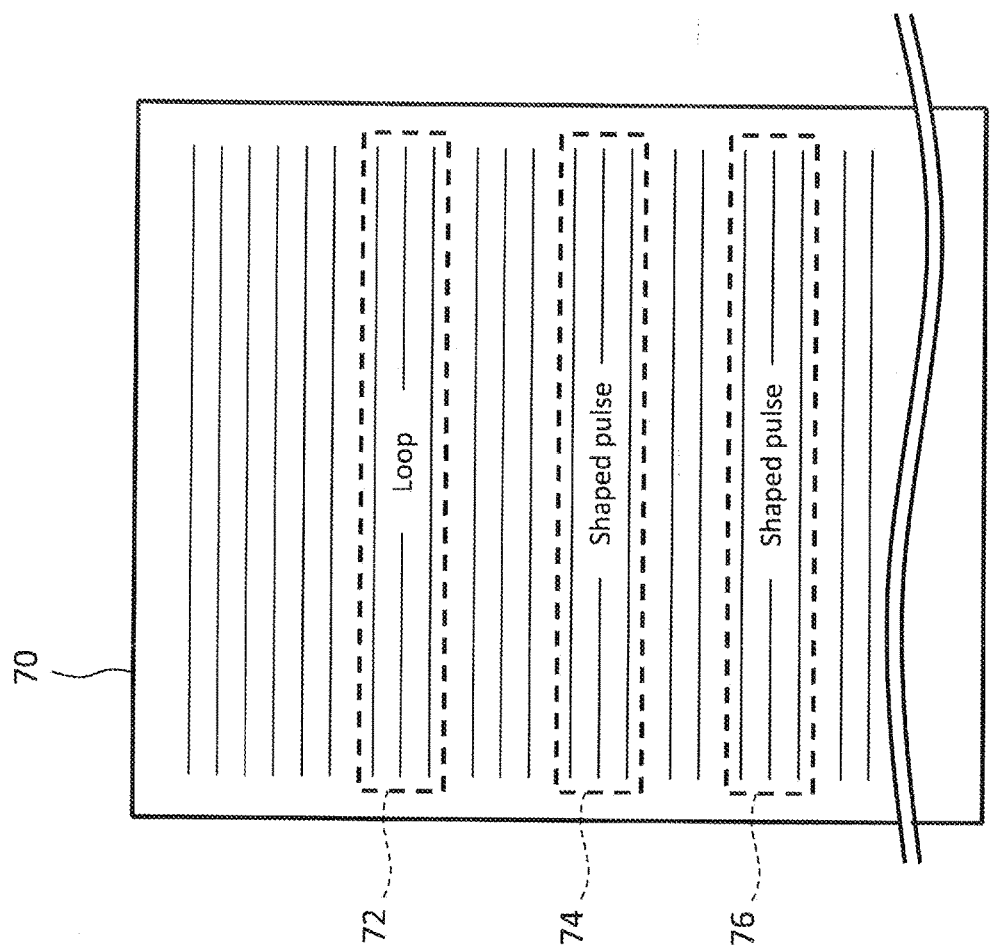

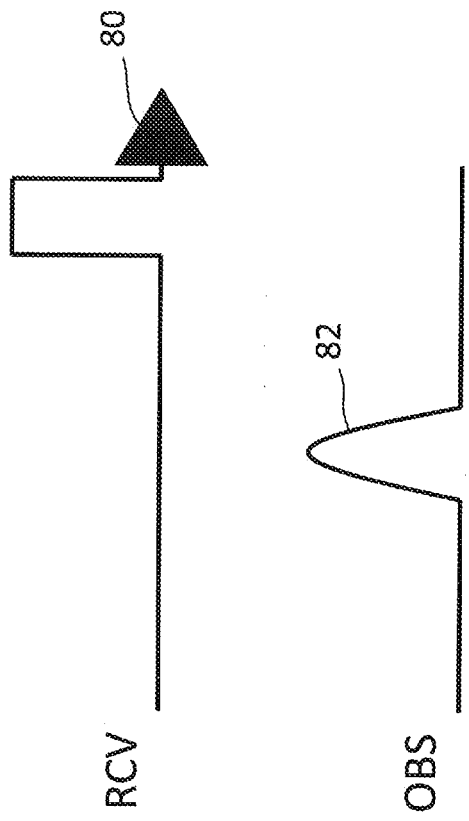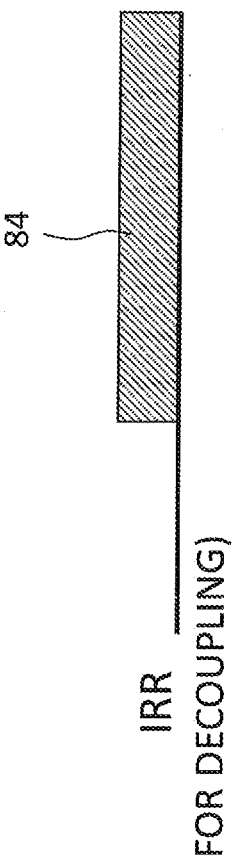
FIG. 4A
FIG. 4B
FIG. 4C

|  | INSTRUCTION DENSITY "LOW" | INSTRUCTION DENSITY "HIGH" |
|---|---|---|
| AMOUNT OF INSTRUCTION "SMALL" | ST TRANSFER | MAKE PROCEDURE, PRECEDENTIAL TRANSFER |
| AMOUNT OF INSTRUCTION "LARGE" | ST TRANSFER |  |

FIG. 6

MAGNETIC RESONANCE MEASUREMENT APPARATUS WITH IMPROVED INSTRUCTION SEQUENCE TRANSFER

CROSS REFERENCE TO RELATED APPLICATIONS

This application claims priority to Japanese Patent Application No. 2014-150826 filed on Jul. 24, 2014, which is incorporated herein by reference in its entirety.

BACKGROUND OF THE INVENTION

Field of the Invention

The present invention relates to a magnetic resonance measurement apparatus, and in particular to a transfer technique of an instruction sequence for executing a pulse sequence.

Description of Related Art

As magnetic resonance measurement apparatuses, nuclear magnetic resonance (NMR) measurement apparatuses and electron spin resonance (ESR) measurement apparatuses are known. In addition, as apparatuses classified as NMR measurement apparatuses, magnetic resonance imaging (MRI) apparatuses are also known. In the following, NMR measurement apparatuses will be described.

NMR refers to a phenomenon where an atomic nucleus under a static magnetic field interacts with an electromagnetic wave having a frequency intrinsic to the atomic nucleus. An apparatus that executes measurement of a sample at an atomic level taking advantage of this phenomenon is an NMR measurement apparatus. Currently, NMR measurement apparatuses are used in analyses of organic compounds (for example, medicines and agricultural chemicals), polymer materials (for example, vinyl and polyethylene), biological substances (for example, nucleic acids and proteins), and the like. With the use of an NMR measurement apparatus, for example, a molecular structure of the sample can be revealed.

An NMR measurement apparatus generally includes a control computer, a radio frequency (RF) signal transmitter, an NMR signal detector (probe), a static magnetic field generator (superconductive magnet), an NMR signal receiver, and the like. In some cases, a part of these structures is called an NMR measurement apparatus. For example, a part of a spectrometer including the control computer, the RF signal transmitter, and the NMR signal receiver may be called an NMR measurement apparatus. In a typical NMR measurement, a high-frequency signal for NMR measurement (RF transmission signal) is generated in the transmitter, and the transmission signal is supplied to a transmission and reception coil in the probe. A resonance absorption phenomenon is caused in an observation nucleus in the sample due to an electromagnetic wave caused by the transmission signal. An NMR signal induced in the transmission and reception coil (RF reception signal) is then transmitted to the receiver, and a spectrum of the received signal is analyzed.

In the NMR measurement apparatus, a pulse program is compiled by a compiler and a sequence of instructions (instruction sequence) is generated. The pulse program is a description of a pulse sequence for realizing a desired NMR measurement. The sequence of instructions is transferred from the compiler to a sequencer unit. The sequencer unit controls operations of the transmitter, the receiver, or the like of the NMR measurement apparatus according to the transferred instruction sequence. In this manner, the NMR measurement is realized.

As the NMR measurement becomes more complex, the quantity of instruction sequences given to the sequencer unit becomes large, and the transfer time of the instruction sequence is also increased. In addition, when the instruction sequence is to be transferred from the compiler to the sequencer unit using a general bus, there is a restriction on the transfer rate. Further, there is a restriction on storage areas of the transfer destination. Because of the restriction on the transfer range, if the pulse sequence operation is to be started after the entirety of the instruction sequence is generated and transferred to the sequencer unit, there is a problem in that the startup of the sequencer unit, and consequently, the start of the measurement, is delayed. In addition, in this configuration, it is necessary to secure a storage area of a large capacity at the transfer destination. In order to handle this, a configuration may be considered in which the measurement is started while the generation and the transfer of the instruction sequence are executed in parallel to each other. However, if there is a sequence of a high density portion in the instruction sequence (for example, an instruction portion for quickly changing many parameters in a short time), the generation and transfer of the instruction sequence would be delayed at that portion, and, as a result, a case may be caused in which the instruction sequence to be referred to by the sequencer unit is exhausted. Such a problem also arises in other magnetic resonance measurement apparatuses.

In an NMR apparatus disclosed in JP 2007-335958 A, a pulse sequence is divided into a plurality of kinds according to a characteristic of the pulse, and the data of unit pulse of each kind is stored in a corresponding segment memory. However, JP 2007-335958 A does not disclose a structure for handling the delay of the start of the measurement and exhaustion of the instruction sequence.

An advantage of the present invention is that, in a magnetic resonance measurement apparatus, delay of the start of the measurement is reduced or prevented, and exhaustion of the instruction sequence to be referred to by the sequencer unit is avoided.

SUMMARY OF THE INVENTION

According to one aspect of the present invention, there is provided a magnetic resonance measurement apparatus comprising: a precedential processor unit that identifies a portion for precedential processing of information for executing magnetic resonance measurement, and that executes a precedential process to transfer a sequence of procedure instructions generated from the identified portion to a first storage unit as a procedure entity, and to generate streaming instruction sequence for transfer in which reference information for identifying the procedure entity is embedded; a transfer unit that repeats sequential transfer of the streaming instruction sequence for transfer, after the precedential transfer process, to a second storage unit in units of transfer from a beginning; a re-construction unit that re-constructs an instruction sequence for execution by referring to the instruction sequence from the beginning, sequentially transferred to the second storage unit, the reconstruction unit re-constructing the instruction sequence for execution by referring to the procedure entity on the first storage unit based on the reference information; and a sequencer unit that executes the instruction sequence for execution which is re-constructed.

More specifically, in the present invention, a precedential transfer of the procedure instruction sequence and a sequential transfer of the streaming instruction sequence are used in combination. For example, an instruction sequence portion which is "heavy" in rate-determining sense is the target of the precedential transfer, and the "light" instruction sequence portion is the target of the sequential transfer. In other words, the heavy instruction sequence portion is transferred first, and the light instruction sequence portion is transferred in a fragmented manner at a later time. The heavy instruction sequence portion is, for example, a portion where the instructions are highly dense, and the light instruction sequence portion is a portion where the density of the instructions is low. For example, an instruction sequence portion for quickly changing many parameters in a short period of time corresponds to the high density portion. In the high density portion, a consumption rate of the instruction sequence at the sequencer unit is faster compared to the case of the low density portion. Therefore, if the instructions included in the high density portion are to be sequentially transferred, there is a possibility that the instruction sequence to be referred to by the sequencer unit is exhausted. That is, there may be cases where the consumption rate of the instruction sequence at the sequencer unit becomes faster than the transfer rate of the instruction sequence, and the transfer of the instruction sequence cannot catch up with the consumption of the instruction sequence. In order to handle such cases, in the present invention, the instruction sequence of the high density portion is transferred preceding the other instruction sequences, as a procedure entity. Alternatively, a portion other than the high density portion may be set as the target of the precedential transfer. On the other hand, in a configuration where all of the instruction sequence is transferred and then the measurement is started, the time required for the transfer would be increased, causing a problem that the start of the measurement is delayed. In particular, in the NMR measurement of a long period of time, in many cases, the total amount of the instruction sequence for the low density portion is very large, and in such cases, the problem becomes more significant. In addition, when the amount of the instruction sequence is very large, a storage area of a large capacity must be secured in the transfer destination, but securing an infinite amount of storage areas is impractical. Thus, in the present invention, the instruction sequence corresponding to the remaining portion is not made into a procedure, and the sequential transfer is employed. With such a configuration, the measurement can be started without waiting for transfer of all instruction sequence. In this manner, by combining the precedential transfer and the sequential transfer of the instruction sequence, it becomes possible to avoid exhaustion of the instruction sequence to be referred to by the sequencer unit, and, at the same time, to quicken the start of the measurement compared to a case where the measurement is started after all of the instruction sequences are transferred. In addition, it becomes unnecessary to secure a storage area of a large capacity in the transfer destination.

According to another aspect of the present invention, preferably, the sequencer unit includes a plurality of sequencers, the instruction sequence for execution is generated for each individual sequencer, and the same procedure entity included in a plurality of instruction sequences for execution for the plurality of sequencers is shared by the plurality of sequencers. According to such a configuration, even if a plurality of the same procedure entities exist, it is not necessary to transfer the plurality of procedure entities. When one of the plurality of procedure entities is transferred, the procedure entity is shared by the sequencers, and the instruction is executed in the sequencers. With such a configuration, the amount of transfer and the time of transfer of the instruction sequence are reduced. In addition, the storage area at the transfer destination can be reduced.

According to another aspect of the present invention, preferably, when the execution information includes portions corresponding to a plurality of procedure entities having the same content, the precedential processor unit transfers one of the plurality of procedure entities to the first storage unit. In this configuration also, because it is not necessary to transfer the plurality of the same procedure entities, the amount of transfer, the time of transfer, and the storage area at the transfer destination can be reduced.

According to another aspect of the present invention, preferably, the precedential processor unit has a function to identify a portion that satisfies a make-procedure condition in the execution information. According to another aspect of the present invention, preferably, the portion that satisfies the make-procedure condition is a portion for realizing a specific pulse sequence. For example, an instruction sequence portion for irradiating a shaped pulse (for example, a mountain-shaped pulse) involving a high-speed modulation other than a rectangular shape is handled as the procedure entity. In many cases, such an instruction sequence corresponds to the high density portion. Thus, by setting these portions as the target of the precedential process, it becomes possible to avoid exhaustion of the instruction sequence at the sequencer unit.

According to another aspect of the present invention, preferably, the reference information is an address on the first storage unit or information that can identify the address. When the reference information is referred to, the storage location of the procedure entity can be identified, and the procedure entity can be read from the storage location. In this manner, the instruction sequence for execution is re-constructed.

According to another aspect of the present invention, preferably, the unit transfer is streaming transfer, and is executed in a parallel manner also after start of execution of the instruction sequence for execution by the sequencer unit. According to such a configuration, the transfer of the instruction sequence to be transferred in the streaming transfer, the re-construction of the instruction sequence, and the execution of the instruction sequence by the sequencer unit are executed in parallel to each other. According to another aspect of the present invention, preferably, the unit transfer is streaming transfer, and generation of the instruction sequence for transfer, transfer of the instruction sequence for transfer, re-construction of the instruction sequence for execution, and execution of the instruction sequence for execution are executed in parallel to each other. According to such a configuration, the generation and the transfer of the instruction sequence to be transferred in the streaming transfer, the re-construction of the instruction sequence, and the execution of the instruction sequence by the sequencer unit are executed in parallel to each other.

According to various aspects of the present invention, in a magnetic resonance measurement apparatus, the delay of start of measurement can be reduced or prevented, and, at the same time, exhaustion of the instruction sequence referred to by a sequencer unit can be avoided.

BRIEF DESCRIPTION OF THE DRAWINGS

Preferred embodiments of the present invention will be described in detail with reference to the following figures, wherein:

FIG. 2 is a diagram schematically showing an example structure of a memory;

FIG. 3 is a diagram schematically showing an example pulse program;

FIG. 4A is a diagram schematically showing an example pulse sequence;

FIG. 4B is a diagram schematically showing an example pulse sequence;

FIG. 4C is a diagram schematically showing an example pulse sequence;

FIG. 6 is a diagram for explaining a transfer condition of an instruction sequence;

DESCRIPTION OF THE INVENTION

A preferred embodiment of the present invention will now be described with reference to the drawings.
(NMR Measurement Apparatus)

Figure 1:
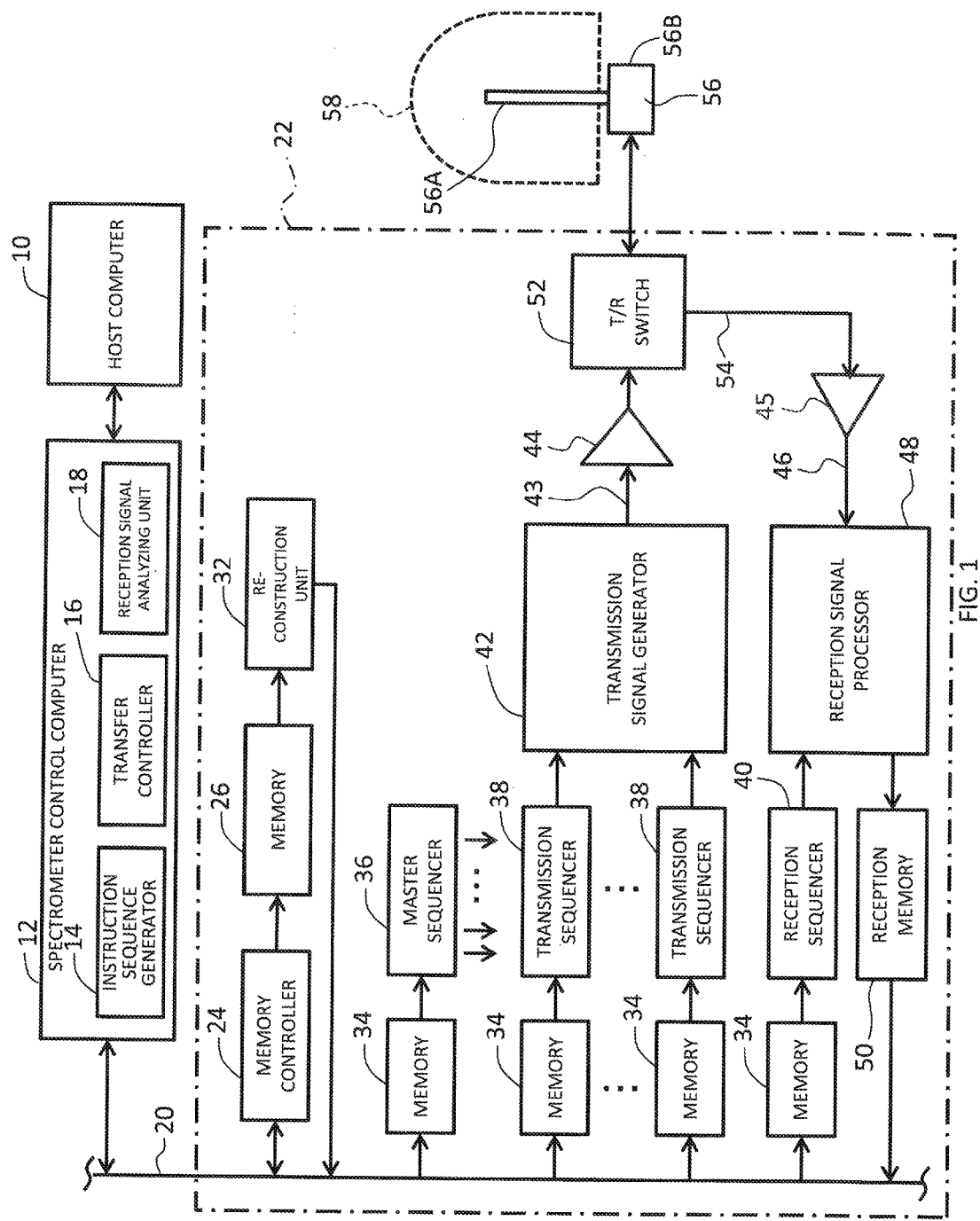
FIG. 1 is a block diagram showing an NMR measurement apparatus according to a preferred embodiment of the present invention.

FIG. 1 shows a preferred embodiment of an NMR measurement apparatus according to the present invention. The NMR measurement apparatus is used for analysis of organic compounds, polymer materials, biological substances, and other substances. A sample to be measured is a liquid sample, a solid sample, or the like. The present invention also can be applied to other magnetic resonance measurement apparatuses.

In FIG. 1, a host computer 10 generates a pulse program. The pulse program is a program describing a pulse sequence for realizing a desired measurement, and is generated by a user or automatically. In the pulse program, for example, a plurality of high frequency (RF) pulses having different frequencies, different phases, different intensities, different output timings, different periods, or the like are combined, and the reception timings and reception periods or the like are combined. The pulse program is sent from the host computer 10 to a spectrometer control computer 12. The host computer 10 may be formed by a typical personal computer.

The spectrometer control computer 12 controls an operation of a transmission and reception unit 22 which will be described in detail later, and analyzes reception data obtained from the transmission and reception unit 22. The spectrometer control computer 12 and the transmission and reception unit 22 form a spectrometer. In the present embodiment, the spectrometer control computer 12 is equipped with a compiler that converts the pulse program (corresponding to an example of execution information) into an instruction sequence. The compiler is shown in FIG. 1 as an instruction sequence generator 14. In the present embodiment, the compiler generates an instruction sequence for transfer, and the instruction sequence for transfer is sent to the transmission and reception unit 22. The transfer of the instruction sequence is executed by a transfer controller 16. In the transmission and reception unit 22, a final instruction sequence (instruction sequence for execution) is generated from the transferred instruction sequence.

When generating the instruction sequence for transfer from the pulse program, the instruction sequence generator 14 identifies a portion for precedential (prior) transfer in the pulse program, and generates the instruction sequence of this portion as a procedure instruction sequence. Alternatively, the instruction sequence generator 14 may identify the procedure instruction sequence to be transferred in the precedential transfer after converting the pulse program into the instruction sequence. In addition, the instruction sequence generator 14 generates, for the pulse program, an instruction sequence sequentially, starting from the beginning, in units for transfer (hereinafter referred to as "streaming instruction sequence"). In this process, the instruction generator 14 generates the streaming instruction sequence in which, in place of the portion of the target of the precedential transfer, reference information for identifying the procedure instruction sequence is embedded. The procedure instruction sequence and the streaming instruction sequence correspond to the instruction sequence for transfer. The transfer unit may be a unit which is determined in advance, or may be changed to an arbitrary unit. For example, the transfer unit may be changed according to the transfer rate. The transfer controller 16 transfers the procedure instruction sequence to the transmission and reception unit 22 prior to the streaming instruction sequence. After the precedential (prior) transfer of the procedure instruction sequence is completed, the transfer controller 16 sequentially transfers, starting from the beginning, the streaming instruction sequence to the transmission and reception unit 22. For the streaming instruction sequence, generation and transfer are executed in a parallel manner. In the following, the transfer of the procedure instruction sequence is referred to as "precedential transfer" and the transfer of the streaming instruction sequence is referred to as "ST transfer (streaming transfer)." The procedure instruction sequence, the streaming instruction sequence, and the transfer process will be described in detail later.

The spectrometer control computer 12 is connected to the transmission and reception unit 22 via a communication bus 20. In the example configuration shown in the drawings, the spectrometer control computer 12 is connected to the host computer 10 via a network. The spectrometer control computer 12 is formed, for example, by a dedicated or general-purpose computer. In the present embodiment, the spectrometer control computer 12 is equipped with an FFT (fast Fourier transform) calculation function for analyzing the spectrum of the reception signal. This function is shown in FIG. 1 as a reception signal analyzing unit 18. The spectrometer control computer 12 is equipped with, in addition to the spectrum analyzing function, a control function, and an administrative function necessary for the NMR measurement. Alternatively, the host computer 10 and the spectrometer control computer 12 may be integrated.

The transmission and reception unit 22 will now be described. The transmission and reception unit 22 generates a transmission signal which is necessary for the NMR measurement, and processes a reception signal which represents a result of the NMR measurement. Alternatively, the transmission and reception unit 22, or a part in which the transmission and reception unit 22 and the spectrometer control computer 12 are combined, may be called the NMR measurement apparatus.

A memory 26 stores the instruction sequence sent from the spectrometer control computer 12. A memory controller 24 executes control for storage of the instruction sequence. The memory controller 24 may be included in the spectrometer control computer 12. A re-construction unit 32 generates the final instruction sequence (corresponding to an example of an instruction sequence for execution) from the instruction sequence stored in the memory 26. Alternatively, the final instruction sequence may be constructed by another circuit. In the present embodiment, while the measurement is executed, the instruction sequence may be generated in parallel with the execution of the measurement. In the memory 26, a plurality of FIFO areas or the like are provided for storing the instruction sequence in units of sequencers.

A plurality of memories 34 store instruction sequences (corresponding to an example of the instruction sequence for execution) to be executed by the individual sequencers. In the present embodiment, six sequencers (a master sequencer 36, four transmission sequencers 38, and a reception sequencer 40) are provided, and, correspondingly, six memories 34 are provided. More specifically, a first memory 34 stores an instruction sequence to be executed by the master sequencer 36. A second memory 34 stores a sequence of instructions to be executed by a first transmission sequencer 38, a third memory 34 stores an instruction sequence to be executed by a second transmission sequencer 38, a fourth memory 34 stores an instruction sequence to be executed by a third transmission sequencer 38, and a fifth memory 34 stores an instruction sequence to be executed by a fourth transmission sequencer 38. A sixth memory 34 stores an instruction sequence to be executed by the reception sequencer 40. In each memory 34, a FIFO area or the like for storing the instruction sequence is provided. In this manner, a plurality of memories 34 that store the instruction sequences in units of sequencers are provided. Alternatively, such a FIFO area may be provided inside each sequencer. The instruction sequence includes various instructions, and includes a setting parameter to be given to each individual circuit.

The master sequencer 36 controls operation timings of the plurality of transmission sequencers 38 and the reception sequencer 40. Specifically, the master sequencer 36 sequentially executes from the beginning the instruction sequence stored in the memory 34 for the master sequencer 36. By synchronous control of the master sequencer 36, the plurality of transmission sequencers 38 and the reception sequencer 40 are synchronously operated.

The plurality of transmission sequencers 38 control the operations of a plurality of transmission signal generators (transmitters) or the like of a transmission signal generator 42. More specifically, each individual transmission sequencer 38 sequentially executes the instruction sequence stored in the memory 34 for the individual transmission sequencer 38, starting from the beginning. In the present embodiment, as an example configuration, four transmission signal generators (four signal generators) are provided, and, correspondingly, four transmission sequencers 38 are provided. The plurality of transmission signals generated by the four signal generators are combined or synthesized and output from the transmission signal generator 42. In the present embodiment, the first transmission sequencer 38 controls a first signal generator, the second transmission sequencer 38 controls a second signal generator, the third transmission sequencer 38 controls a third signal generator, and the fourth transmission sequencer 38 controls a fourth signal generator. However, the one-to-one correspondence relationship is not a requirement, and alternatively, one transmission sequencer 38 may control a plurality of signal generators or a plurality of transmission sequencers 38 may control one signal generator. The control of the operations of a circuit that combines the plurality of the transmission signals and operations of circuits provided downstream thereof is executed by a part or all of the four transmission sequencers 38. The numerical values explicitly described in the present disclosure are given only as exemplary values.

The reception sequencer 40 basically has the same structure as the individual transmission sequencer 38, and sequentially executes the instruction sequence stored in the memory 34 for the reception sequencer 40 from the beginning. With such a configuration, the operation of each circuit of a reception signal processor 48 (receiver) is controlled.

The transmission signal generator 42 includes a plurality of signal generators serving as the plurality of transmission signal generators, an adder serving as the combiner, a D/A converter (DAC), a signal processor circuit, a frequency converter circuit, or the like. The transmission signal generator 42 generates an RF transmission signal 43 for NMR measurement. The RF transmission signal 43 is an analog signal, and is transmitted to a power amplifier 44 that executes linear amplification. The RF transmission signal amplified by the power amplifier 44 is transmitted to a probe 56 via a T/R switch (transmission and reception switch) 52.

The probe 56 includes an insertion section 56A having a transmission and reception coil (not shown), and a housing section 56B corresponding to a root portion of the insertion section 56A. In the example configuration shown in the drawings, the probe has one port, and thus one RF transmission signal is input to the probe. Alternatively, a probe having two or more ports may be used. The insertion section 56A has a cylindrical shape, and is inserted into a bore (cylindrical cavity) of a static magnetic field generator 58. When the RF transmission signal is supplied to the transmission and reception coil, an electromagnetic wave generated in the coil is irradiated onto the sample, and a resonance absorption phenomenon occurs at the observation nucleus of the sample. Then, the NMR signal induced in the transmission and reception coil (RF reception signal) is transmitted from the probe 56 to the reception signal processor 48 via the T/R switch 52.

In the present embodiment, the T/R switch 52 has a routing function to transmit the RF transmission signal to the probe during the transmission and to transmit the RF reception signal from the probe to the reception signal processor 48 during reception. A reception signal 54 from the T/R switch 52 is amplified by a pre-amplifier 45, and an amplified reception signal 46 is transmitted to the reception signal processor 48. Alternatively, the pre-amplifier 45 may be built in the T/R switch 52.

The reception signal processor 48 in the transmission and reception unit 22 is a circuit which executes processes such as a frequency conversion, an A/D (analog-to-digital) conversion, a quadrature detection, or the like on the input RF reception signal. The processed reception signal (complex signal) is temporarily stored in reception memory 50 as reception data. The reception data which is read from the reception memory 50 is transmitted to the spectrometer control computer 12, and the analysis of the reception data is executed therein. Alternatively, the reception data may be analyzed in the transmission and reception unit 22.

A structure of the memory 26 will now be described with reference to FIG. 2. In the memory 26, a FIFO area 28 and a procedure storage area 30 are provided. In the FIFO area 28, a plurality of FIFO areas (FIFO areas 280~285) for storing the instruction sequence in units of sequencers are provided. Specifically, in the FIFO area 280, the instruction sequence for the master sequencer 36 is stored. In the FIFO area 281, the instruction sequence for the first transmission sequencer 38 is stored; in the FIFO area 282, the instruction sequence for the second transmission sequencer 38 is stored; in the FIFO area 283, the instruction sequence for the third transmission sequencer 38 is stored; and in the FIFO area 284, the instruction sequence for the fourth transmission sequencer 38 is stored. In the FIFO area 285, the instruction sequence for the reception sequencer 40 is stored. The procedure storage area 30 functions as a shared memory, and is shared among the master sequencer 36, the plurality of transmission sequencers 38, and the reception sequencer 40. As will be described later, an instruction sequence for executing a specific pulse sequence (procedure instruction sequence) is stored in the procedure storage area 30. In the FIFO areas 280~285, of the instruction sequences, instruction sequences other than the procedure instruction sequence (streaming instruction sequences) are stored. The FIFO areas 280~285 are formed, for example, by a ring buffer.

The pulse program will now be described with reference to FIG. 3. A pulse program 70 describes a pulse sequence. The pulse program 70 describes, for example, various execution information such as setting parameters for the plurality of high-frequency pulses (such as frequency, phase, and intensity), an output timing of the high-frequency pulse, a detection timing of the reception signal, setting parameters of the circuits, or the like. The pulse program 70 includes a sequence of portions 72 for repeatedly executing a predetermined pulse sequence (a portion described in FIG. 3 as "Loop"), sequences of portions 74 and 76 for executing irradiation of a specific high-frequency pulse (a portion described in FIG. 3 as "Shaped pulse"), or the like. The portions 72, 74, and 76 are collections of a plurality of pulse sequence descriptions. When the pulse program 70 is compiled by the instruction sequence generator 14, the instruction sequence (procedure instruction sequence and streaming instruction sequence) is generated.

FIGS. 4A, 4B, and 4C show an example of a pulse sequence. FIGS. 4A, 4B, and 4C show a part of the pulse sequence. FIG. 4A shows a pulse sequence for a reception channel (RCV). A triangle 80 shows a detection timing of the reception signal. This pulse sequence is executed by the reception sequencer 40. FIGS. 4B and 4C show pulse sequences for a transmission channel. These pulse sequences are executed by the transmission sequencers 38. A pulse sequence shown in FIG. 4B (OBS) is for obtaining the NMR signal, and shows a pulse 82 to be output. The pulse 82 corresponds to the "Shaped pulse" described above, and has a mountain-like shape. A pulse sequence 84 shown in FIG. 4C (IRR) is a pulse sequence for decoupling; that is, a pulse sequence for separating coupling of unnecessary interactions. Although not shown in FIGS. 4A, 4B, and 4C, the pulse sequence may also include instructions for outputting a 90-degree pulse, a 180-degree pulse, or the like.

Figure 5:
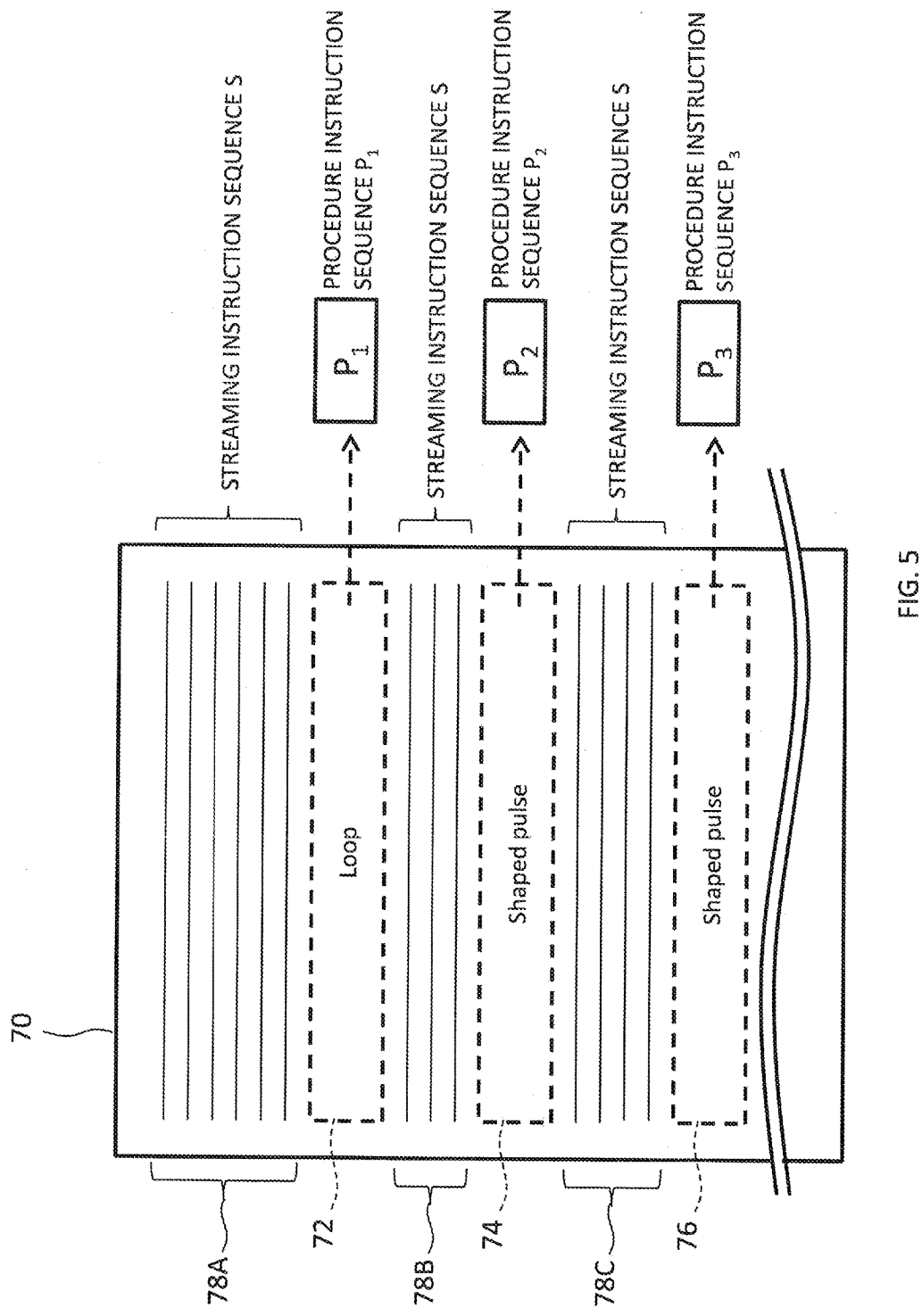
FIG. 5 is a diagram for explaining a streaming instruction sequence and a procedure instruction sequence.

A generation process of the instruction sequence will now be described with reference to FIG. 5. The instruction sequence generator 14 identifies a portion for precedential transfer in the pulse program 70, and generates an instruction sequence for the identified portion as a procedure instruction sequence. As an example, the portion 72 for executing a loop process and the portions 74 and 76 for irradiating a shaped pulse are the target of the precedential transfer. The instruction sequence generator 14 compiles the portion 72 to generate a procedure instruction sequence $P_1$ from the portion 72. Similarly, the instruction sequence generator 14 compiles the portions 74 and 76, to generate procedure instruction sequences $P_2$ and $P_3$ from the portions 74 and 76, respectively. The instruction sequence generator 14 generates a procedure instruction sequence for the master sequencer 36, a procedure instruction sequence for each individual transmission sequencer 38, and a procedure instruction sequence for the reception sequencer 40. For example, the instruction sequence generator 14 generates the procedure instruction sequence for each sequencer according to the function of each sequencer. The instruction sequence generator 14 generates, for example, the procedure instruction sequence for the master sequencer 36 from the portion for controlling the operation timings or the like of the plurality of transmission sequencers 38 and the reception sequencer 40. The instruction sequence generator 14 generates the procedure instruction sequence for each individual transmission sequencer 38 from the portion for controlling the operation of the transmission signal generator 42. The instruction sequence generator 14 generates the procedure instruction sequence for the reception sequencer 40 from the portion for controlling the operation of the reception signal processor 48. In some cases, a sequencer may exist which does not execute an instruction sequence shown by the procedure instruction sequence. In such cases, the procedure instruction sequence for that sequencer is not generated.

When there exist a plurality of portions corresponding to a same procedure instruction sequence in the pulse program 70, the instruction sequence generator 14 generates one procedure instruction sequence, among the plurality of procedure instruction sequences. The generated procedure instruction sequence is set as a representative (common) procedure instruction sequence. For example, when the portions 74 and 76 are identical to each other; that is, when the procedure instruction sequences $P_2$ and $P_3$ are identical to each other, the instruction sequence generator 14 generates, among the procedure instruction sequences $P_2$ and $P_3$, one procedure instruction sequence (for example, the procedure instruction sequence $P_2$ which appears first). Alternatively, the instruction sequence generator 14 may generate a plurality of the same procedure instruction sequences.

The instruction sequence generator 14 manages an address of the memory 26 of the transmission and reception unit 22, and designates a head address of the storage location of the procedure instruction sequence (address in the procedure storage area 30). The reference information is not limited to the address information indicating the head address, and may be any information that can specify the address of the storage location of the procedure instruction sequence. When a plurality of the same procedure instruction sequences exist and a representative procedure instruction sequence among these instruction sequences is stored in the procedure storage area 30, the same address information is embedded in each portion for the precedential transfer.

For the pulse program 70, the instruction sequence generator 14 sequentially generates a streaming instruction sequence S in transfer units from the beginning. With this process, streaming instruction sequences S corresponding to portions 78A, 78B, 78C, . . . are generated. In this process, the instruction sequence generator 14 generates a streaming instruction sequence in which, in place of the portion to be transferred in precedential manner, address information indicating the head address of the storage location of the procedure instruction sequence (corresponding to an example of reference information) is embedded. The storage location of the procedure instruction sequence can be identified by referring to the address information in the streaming instruction sequence. The instruction sequence generator 14 generates, according to the functions of the sequencers, a streaming instruction sequence for the master sequencer 36, a streaming instruction sequence for each individual transmission sequencer 38, and a streaming instruction sequence for the reception sequencer 40.

The procedure instruction sequence and the streaming instruction sequence are sent to the transmission and reception unit 22, and stored in the memory 26. The procedure instruction sequence is stored in the procedure storage area 30 on the memory 26 shown in FIG. 2, and the streaming instruction sequence is stored in the FIFO area 28.

A transfer condition of the instruction sequence will now be described from the viewpoint of an amount of instruction and a density. In the present embodiment, a sequence of a high density portion in the instruction sequence is made into a procedure and is set as a target of precedential transfer. For example, an instruction sequence for quickly changing many parameters in a short period of time corresponds to the high density portion. In the example configuration shown in FIG. 3, the instruction sequence portion 72 for executing the loop process, and the portions 74 and 76 for outputting and irradiating the shaped pulse correspond to the high density portions. For example, the portions 74 and 76 include a plurality of instructions for quickly changing many parameters in a short period of time, in order to form the shaped pulse. An instruction sequence included in such a high density portion has a quick consumption rate at the sequencer compared to the instruction sequence of other portions. Therefore, if the instruction sequences at the high density portions are generated as streaming instruction sequences and the generation and transfer thereof are executed in a parallel manner (when the ST transfer is executed), there is a possibility that the instruction sequence to be referred to by the sequencer is exhausted. In other words, the consumption rate of the instruction sequence at the sequencer becomes higher than the rate of generation and transfer of the streaming instruction sequences, resulting in an inability for the generation and transfer of the streaming instruction sequence to catch up to the consumption of the instructions, and, consequently, possible exhaustion of the instruction sequence at the sequencer. In order to handle such a case, in the present embodiment, the instruction sequence at the high density portion is made into a procedure and not transferred in ST transfer, and is transferred prior to the other instruction sequences.

On the other hand, if the measurement is to be started after all of the instruction sequences are transferred, the time required for generating and transferring all of the instruction sequences would be increased, causing a problem of delaying the start of the measurement. In addition, it is necessary to provide, in the transmission and reception unit 22 which is the transfer destination, a large-capacity memory that can store all instruction sequences. In consideration of this, in the present embodiment, the instruction sequence in the low density portion is not made into a procedure, and is transferred by ST transfer. In other words, the streaming instruction sequence is sequentially generated from the low density portion, and the generated streaming instruction sequence is sequentially transferred. With such a configuration, the measurement can be started without waiting for the generation and transfer of all of the instruction sequences. Moreover, it becomes unnecessary to provide the large-capacity memory in the transmission and reception unit 22. In this manner, in the present embodiment, the precedential transfer and the ST transfer of the instruction sequence are employed in a combined manner.

FIG. 6 shows a table summarizing these configurations. The high density portion of the instruction sequence is made into a procedure and transferred by precedential transfer, and the streaming instruction sequence is generated for the low density portion and the ST transfer is executed. For the low density portion, the ST transfer is executed regardless of whether the amount of instructions in the low density portion is small or large. On the other hand, if a portion having a high density and having a large amount of instructions is set as a target of precedential transfer, the time required for the generation and transfer of the procedure instruction sequence would be increased, and, consequently, the start of the measurement would be correspondingly delayed. Therefore, in the present embodiment, the portion having a high density and a small amount of instructions is set as the target of precedential transfer. Because of the characteristic of the NMR measurement, a case where the high density instruction portion continues for a long period cannot be conceived, and, in reality, there is a low possibility that a portion of high density and a large amount of instructions occurs.

Figure 7:
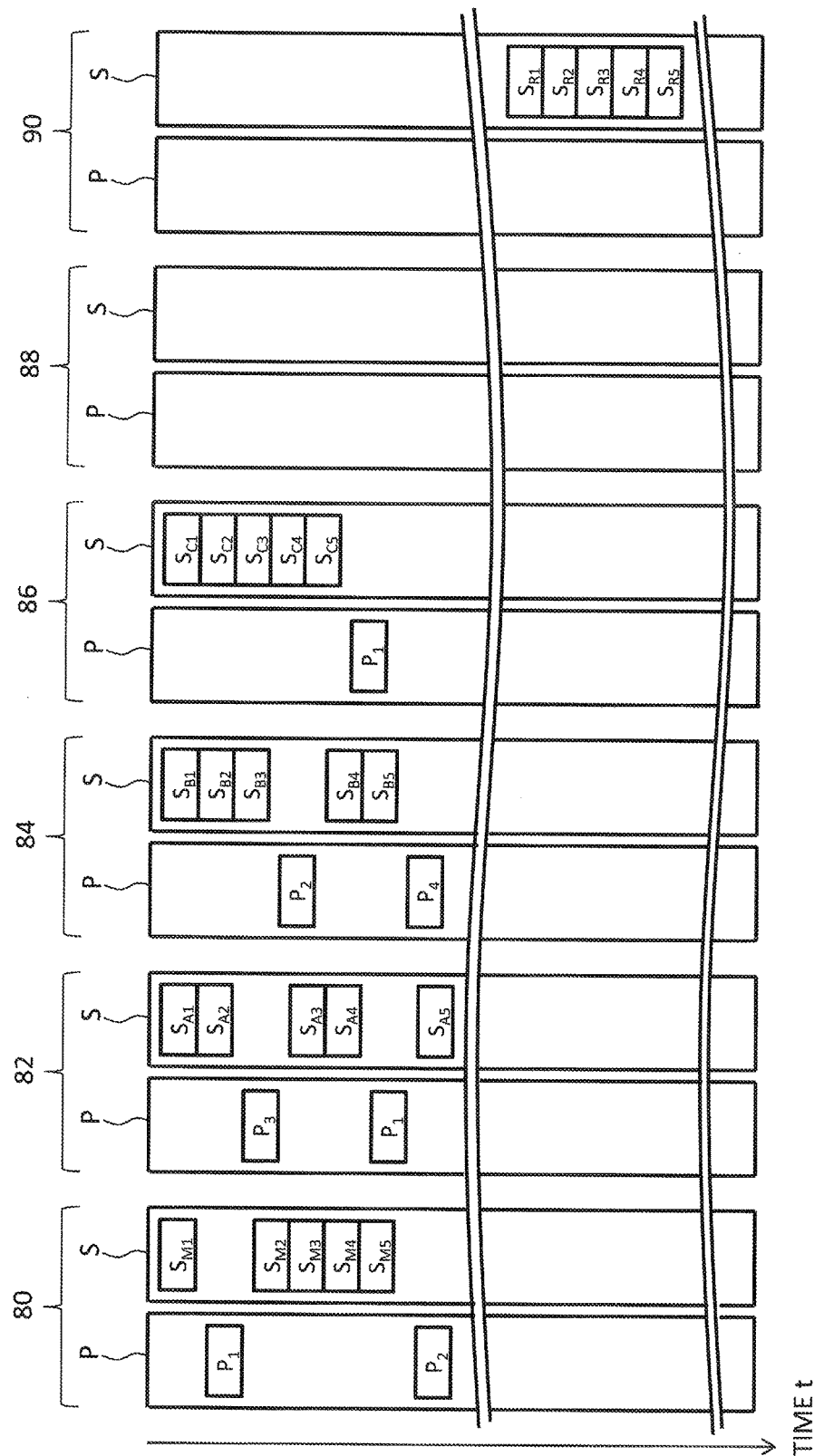
FIG. 7 is a diagram schematically showing an example instruction sequence for each sequencer.

FIG. 7 shows an example instruction sequence for each sequencer. Reference numeral 80 indicates an instruction sequence for the master sequencer 36. Reference numerals 82~88 indicate instruction sequences for individual transmission sequencers 38. For example, reference numeral 82 indicates an instruction sequence for the first transmission sequencer 38, reference numeral 84 indicates an instruction sequence for the second transmission sequencer 38, reference numeral 86 indicates an instruction sequence for the third transmission sequencer 38, and reference numeral 88 indicates an instruction sequence for the fourth transmission sequencer 38. Reference numeral 90 indicates an instruction sequence for the reception sequencer 40. Reference sign P indicates a procedure instruction sequence, and reference sign S indicates a streaming instruction sequence. A vertical axis indicates time t, and the process proceeds in the direction of the arrow (downward). In each sequencer, the instruction sequences are executed according to the order of the instruction sequence.

As a specific example for explanation, the instruction sequence for the master sequencer 36 (instruction sequence 80) includes streaming instruction sequences $S_{M1} \sim S_{M5}$, ... and procedure instruction sequences $P_1, P_2, \ldots$. The master sequencer 36 executes the instructions in the order of instruction sequences $S_{M1}, P_1, S_{M2}, S_{M3}, S_{M4}, S_{M5}, P_2, \ldots$. As an example, the streaming instruction sequence $S_{M1}$ includes address information indicating the head address of the storage location of the procedure instruction sequence $P_1$ (the address information is embedded). By referring to the address information, it is possible to identify the storage location of the procedure instruction sequence $P_1$ to be executed next after the streaming instruction sequence $S_{M1}$. Similarly, the streaming instruction sequence $S_{M5}$ includes address information indicating the head address of the storage location of the procedure instruction sequence $P_2$.

This is similarly applicable to other sequencers. The instruction sequence for the first transmission sequencer 38 (instruction sequence 82) includes streaming instruction sequences $S_{A1} \sim S_{A5}$, ... and procedure instruction sequences $P_1, P_3, \ldots$. The instruction sequence for the second transmission sequencer 38 (instruction sequence 84) includes streaming instruction sequences $S_{B1} \sim S_{B5}$, ... and procedure instruction sequences $P_2, P_4, \ldots$. The instruction sequence for the third transmission sequencer 38 (instruction sequence 86) includes streaming instruction sequences $S_{C1} \sim S_{C5}$, . . . and procedure instruction sequences $P_1$, . . . . The instruction sequence for the fourth transmission sequencer 38 (instruction sequence 88) does not include any instruction sequence, and the sequencer is not used. The instruction sequence for the reception sequencer 40 (instruction sequence 90) includes streaming instruction sequences $S_{R1} \sim S_{R5}$, . . . . In the example configuration shown in FIG. 7, the instruction sequence for the reception sequencer 40 does not include a procedure instruction sequence, but alternatively, the instruction sequence for the reception sequencer 40 may include a procedure instruction sequence. In addition, although the instruction sequence for the fourth transmission sequencer 38 does not include any streaming instruction sequence or any procedure instruction sequence, alternatively, the instruction sequence may include a procedure instruction sequence and a streaming instruction sequence for referring to the procedure instruction sequence.

There may be cases where the same procedure instruction sequence is executed by each of a plurality of sequencers. For example, the procedure instruction sequence $P_2$ is included in the instruction sequence for the master sequencer 36 (reference numeral 80) and the instruction sequence for the second transmission sequencer 38 (reference numeral 84). Therefore, the procedure instruction sequence $P_2$ is executed by the master sequencer 36 and also by the second transmission sequencer 38. In this case also, as described above, one procedure instruction sequence $P_2$ is stored in the procedure storage area 30 of the memory 26, and the procedure instruction sequence $P_2$ is shared by the master sequencer 36 and the second transmission sequencer 38. This is also similarly applicable for the other procedure instruction sequences. Specifically, when the same procedure instruction sequence is executed by each of the plurality of sequencers, one of the plurality of the same procedure instruction sequences is stored in the procedure storage area 30 of the memory 26.

The correspondence relationship between the procedure instruction sequence and the streaming instruction sequence shown in FIG. 7 is shown in an aligned manner for convenience of explanation of the order of instructions to be executed. Thus, FIG. 7 does not show the specific storage form of the instruction sequences in the memory 26. For example, while FIG. 7 shows a plurality of the same procedure instruction sequences, the showing is merely for explaining the instruction sequence executed by the sequencers, and, in the present embodiment, one of these plurality of procedure instruction sequences is stored in the memory 26.

Figure 8:
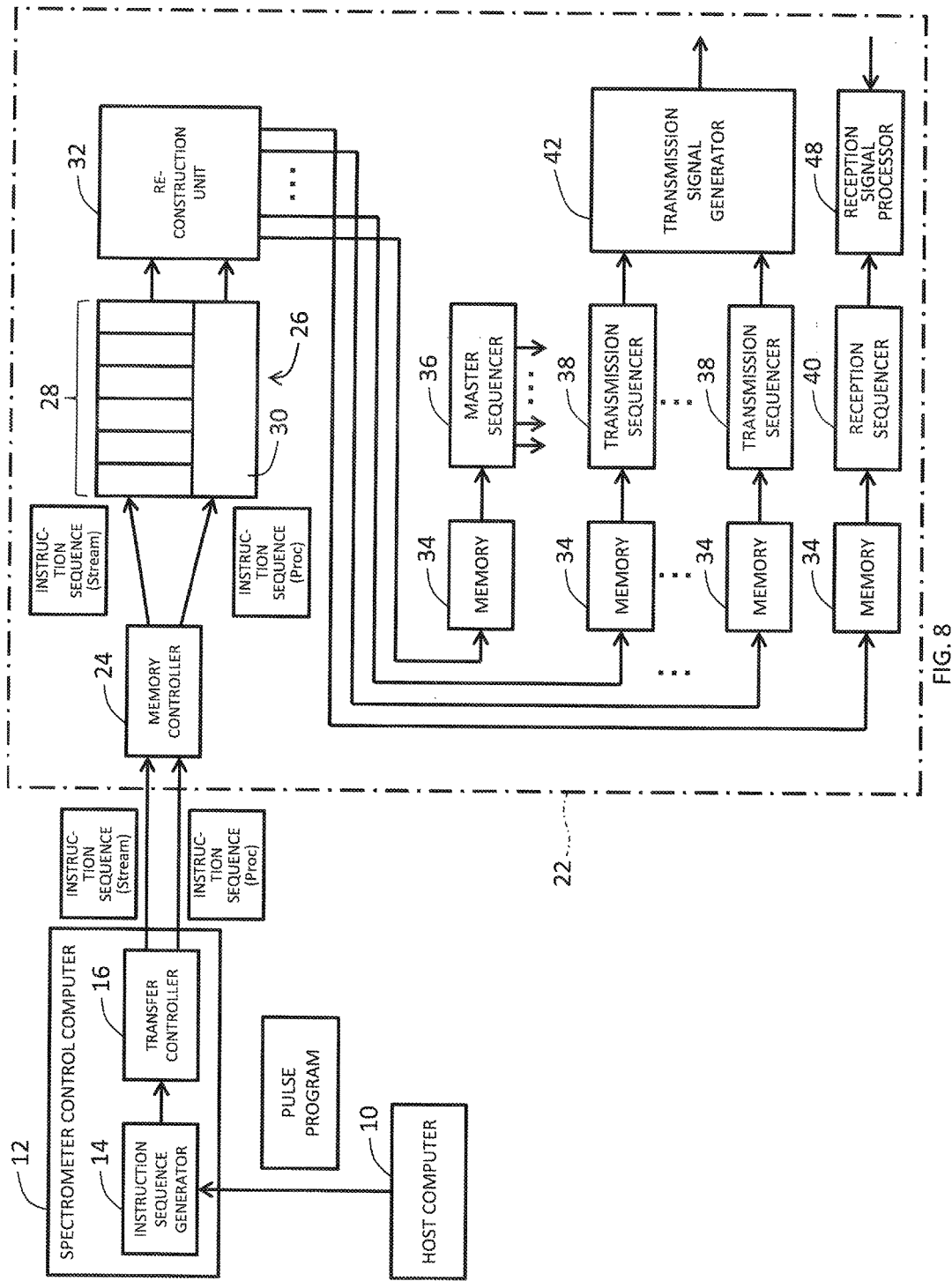
FIG. 8 is a diagram for explaining an outline of a transfer process and a re-construction process of an instruction sequence.

Next, an outline of a transfer process and a re-construction process of the instruction sequence will be described with reference to FIG. 8. FIG. 8 shows a structure related to the transfer process and the re-construction process, and structures not related to these processes are omitted.

First, the pulse program is generated by the host computer 10. The pulse program is sent to the spectrometer control computer 12. The instruction sequence generator 14 refers to the entirety of the pulse program, extracts a portion to be transferred by the precedential transfer, and generates the procedure instruction sequence from the extracted portion. The instruction sequence generator 14 also sequentially generates the streaming instruction sequence in transfer units from the beginning of the pulse program. In this process, the instruction sequence generator 14 generates the streaming instruction sequence in which, in place of the portion of precedential transfer, address information of the storage location of the procedure instruction sequence is embedded. Alternatively, the instruction sequence generator 14 may compile the pulse program to temporarily generate the instruction sequence, and identify the procedure instruction sequence for the precedential transfer from among the instruction sequences. In this case also, in generation of the streaming instruction sequence, the streaming instruction sequence is generated in which, in place of the portion of the precedential transfer, the address information of the storage location of the procedure instruction sequence is stored.

The transfer controller 16 transfers the procedure instruction sequence ("instruction sequence (Proc)" in FIG. 8) prior to the transfer of the streaming instruction sequence ("instruction sequence (Stream)" in FIG. 8) to the transmission and reception unit 22. After the transfer of the procedure instruction sequence is completed, the transfer controller 16 sequentially transfers the streaming instruction sequence which is sequentially generated, to the transmission and reception unit 22. When a plurality of procedure instruction sequences are generated, the transfer of the streaming instruction sequence is started after all of the plurality of procedure instruction sequences are transferred.

The memory controller 24 stores the procedure instruction sequence (instruction sequence (Proc)) in the procedure storage area 30 (shared area) on the memory 26. In addition, the memory controller 24 stores the streaming instruction sequence (instruction sequence (Stream)) in the FIFO area 28 on the memory 26.

The re-construction unit 32 generates a final instruction sequence from the instruction sequence stored in the memory 26. Specifically, the re-construction unit 32 reads the streaming instruction sequence on each FIFO area included in the FIFO area 28 (FIFO areas 280~285 in FIG. 2) from the beginning, and writes the read instruction sequence to a corresponding memory 34 (FIFO memory). For example, the re-construction unit 32 reads the streaming instruction sequence on the FIFO area 280 from the beginning, and writes the read instruction sequence in the memory 34 for the master sequencer 36. When address information is included (embedded) in the read streaming instruction sequence, the re-construction unit 32 reads a procedure instruction sequence stored in the address indicated by the address information from the procedure storage area 30. The re-construction unit 32 interprets and decompresses the procedure instruction sequence, and writes the resulting instruction sequence in the memory 34 for the master sequencer 36. A similar process is executed for the other sequencers. In this manner, the final instruction sequence to be executed by each sequencer is written to each memory 34. When an instruction to start measurement is given, each sequencer sequentially executes the instruction sequence stored in the memory 34 for the sequencer from the beginning.

After the measurement is started, the generation of the streaming instruction sequence by the instruction sequence generator 14, the transfer of the streaming instruction sequence by the transfer controller 16 to the transmission and reception unit 22, the re-construction of the instruction sequence by the re-construction unit 32, and the executions of the instruction sequences by the sequencers are executed in parallel to each other. In other words, the sequencers execute the instruction sequences while the streaming instruction sequence is generated, transferred, and re-constructed.

Figure 9:
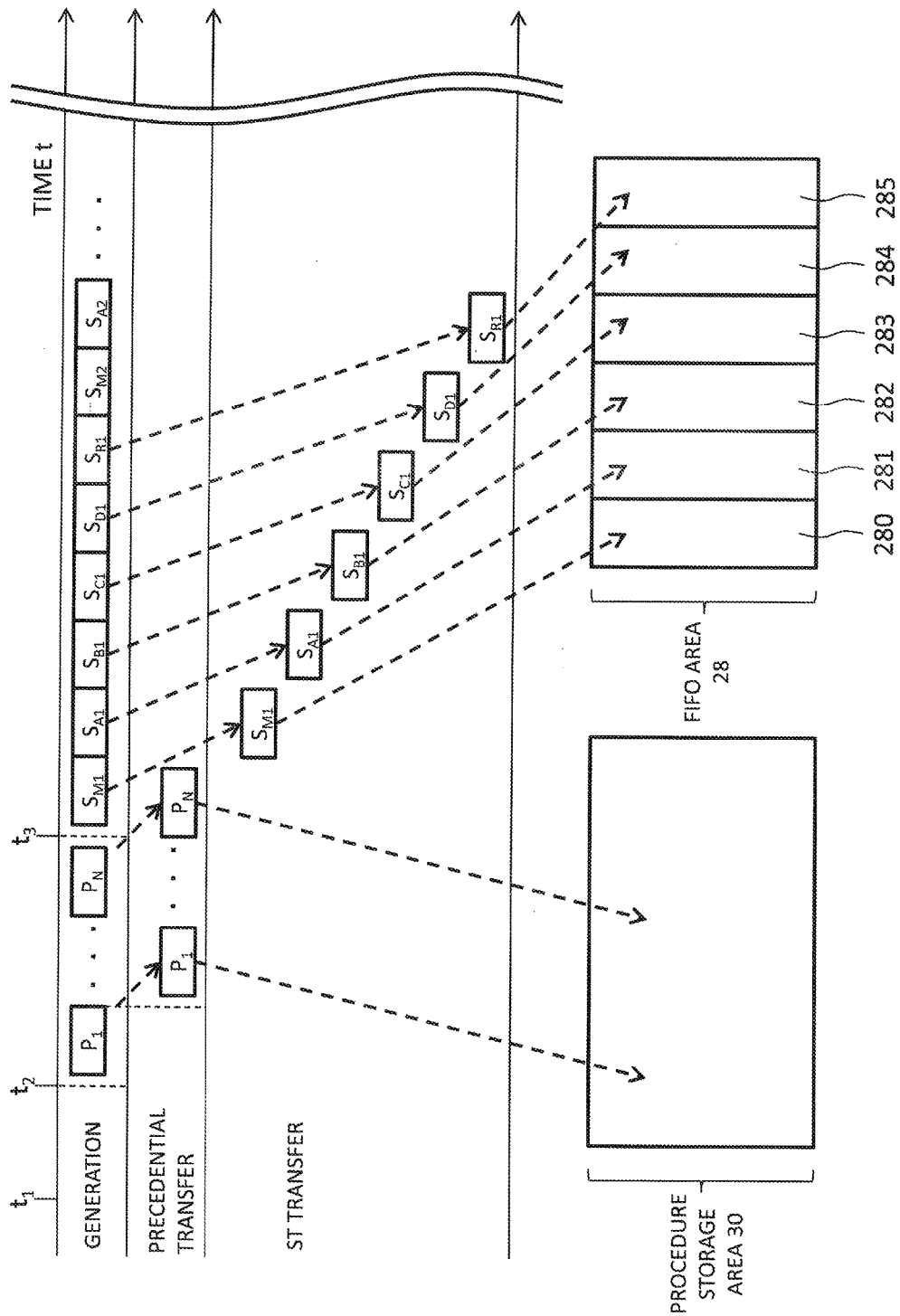
FIG. 9 is a diagram for explaining a generation process and a transfer process of an instruction sequence in a time sequential manner.

Next, details of the generation process and the transfer process of the instruction sequence will be described with reference to FIG. 9. In FIG. 9, the horizontal axis represents time t. At time $t_1$, the pulse program is sent to the spectrometer control computer 12. In a period until time $t_2$, the instruction sequence generator 14 refers to the entirety of the pulse program, and identifies a portion to be transferred by precedential transfer. In the period between time $t_2$ and time $t_3$, the instruction sequence generator 14 generates procedure instruction sequences $P_1$~$P_N$ from the pulse program. When a plurality of the same procedure instruction sequence exist, one of the procedure instruction sequences is generated.

The transfer controller 16 transfers the procedure instruction sequences $P_1$~$P_N$ to the transmission and reception unit 22 (precedential transfer). The transfer controller 16 may sequentially transfer the generated procedure instruction sequence to the transmission and the reception unit 22 every time the procedure instruction sequence is generated. As an alternative configuration, the transfer controller 16 may transfer the procedure instruction sequences $P_1$~$P_N$ to the transmission and reception unit 22 after all of the procedure instruction sequences $P_1$~$P_N$ are generated. In the example configuration shown in FIG. 9, the procedure instruction sequences are sequentially transferred to the transmission and reception unit 22 every time the procedure instruction sequence is generated. The transferred procedure instruction sequences $P_1$~$P_N$ are stored in the procedure storage area 30 on the memory 26.

Meanwhile, when the generation of the procedure instruction sequences $P_1$~$P_N$ is completed, the instruction sequence generator 14 sequentially generates streaming instruction sequences from the beginning of the pulse program in units of transfers. In this process, the instruction sequence generator 14 generates the streaming instruction sequence in which address information of a storage location of the procedures instruction sequence is embedded in place of apportion of precedential transfer in the pulse program. As an example, the instruction sequence generator 14 generates the streaming instruction sequences for the sequencers in number of transfer units (for example, one) in order. Specifically, the instruction sequence generator 14 sequentially generates the streaming instruction sequence $S_{M1}$ for the master sequencer 36, the streaming instruction sequence $S_{A1}$ for the first transmission sequencer 38, the streaming instruction sequence $S_{B1}$ for the second transmission sequencer 38, the streaming instruction sequence $S_{C1}$ for the third transmission sequencer 38, the streaming instruction sequence $S_{D1}$ for the fourth transmission sequencer 38, the streaming instruction sequence $S_{R1}$ for the reception sequencer 40, the streaming instruction sequence $S_{M2}$ for the master sequencer 36, the streaming instruction sequence $S_{A2}$ for the first transmission sequencer 38, . . . . In the subsequent periods also, the instruction sequence generator 14 continues to generate the streaming instruction sequences for the sequencers in the number of transfer units in order. The transfer controller 16 transfers the streaming instruction sequence to the transmission and reception unit 22 every time the streaming instruction sequence is generated. In other words, the generation and the transfer of the streaming instruction sequence are executed in parallel to each other. In this manner, the streaming transfer (ST transfer) is realized. For example, when the streaming instruction sequences $S_{M1}$, $S_{A1}$, $S_{B1}$, $S_{C1}$, $S_{D1}$, $S_{R1}$, $S_{M2}$, $S_{A2}$, . . . are generated in that order, the transfer controller 16 transfers the streaming instruction sequences to the transmission and reception unit 22 in the order of generation, every time one of the streaming instruction sequences is generated.

The order of generation of the streaming instruction sequence is not limited to the above-described example configuration. For example, a configuration may be employed in which, after a certain amount of the streaming instruction sequences for the master sequencer 36 and for the transmission sequencers 38 is generated and transferred, the streaming instruction sequence for the reception sequencer 40 is generated and transferred. The configuration is not limited to such a configuration, and the order of generation and transfer of the streaming instruction sequence may be suitably changed. In addition, in the above-described example configuration, the streaming instruction sequences for the sequencers are sequentially generated for each sequencer, but alternatively, the streaming instruction sequences for the sequencers may be generated in parallel to each other or simultaneously.

The streaming instruction sequence transferred to the transmission and reception unit 22 is stored in the FIFO area 28 on the memory 26. Each streaming instruction sequence is stored in the FIFO area 28 in the order of transfer. In the present embodiment, the streaming instruction sequences are stored in the FIFO areas prepared for the sequencers. Specifically, the streaming instruction sequence $S_{M1}$ for the master sequencer 36 is stored in the FIFO area 280 for the master sequencer 36. The streaming instruction sequence $S_{A1}$ for the first transmission sequencer 38 is stored in the FIFO area 281 for the first transmission sequencer 38. The streaming instruction sequence $S_{B1}$ for the second transmission sequencer 38 is stored in the FIFO area 282 for the second transmission sequencer 38. The streaming instruction sequence $S_{C1}$ for the third transmission sequencer 38 is stored in the FIFO area 283 for the third transmission sequencer 38. The streaming instruction sequence $S_{D1}$ for the fourth transmission sequencer 38 is stored in the FIFO area 284 for the fourth transmission sequencer 38. The streaming instruction sequence $S_{R1}$ for the reception sequencer 40 is stored in the FIFO area 285 for the reception sequencer 40. The streaming instruction sequence $S_{M2}$ for the master sequencer 36 is stored in the FIFO area 280 for the master sequencer 36. The streaming instruction sequence $S_{A2}$ for the first transmission sequencer 38 is stored in the FIFO area 281 for the first transmission sequencer 38. The streaming instruction sequences $S_{M1}$, $S_{A1}$, $S_{B1}$, $S_{C1}$, $S_{D1}$, $S_{R1}$, $S_{M2}$, $S_{A2}$, . . . are stored in the FIFO areas in this order. The subsequent instruction sequences are handled in a similar manner. Namely, the transferred streaming instruction sequences are sequentially stored in the corresponding FIFO areas. Alternatively, of the transfers described above, a part or all of the transfers for the sequencers may be executed in parallel to each other.

The ST transfer will now be summarized. For example, the streaming instruction sequences $S_{M1}$, $S_{A1}$, $S_{B1}$, $S_{C1}$, $S_{D1}$, $S_{R1}$, $S_{M2}$, $S_{A2}$, . . . are generated in this order. Every time the streaming instruction sequence is generated, the generated streaming instruction sequence is transferred to the transmission and reception unit 22. Therefore, the streaming instruction sequences $S_{M1}$, $S_{A1}$, $S_{B1}$, $S_{C1}$, $S_{D1}$, $S_{R1}$, $S_{M2}$, $S_{A2}$, . . . are transferred to the transmission and reception unit 22 in that order. The streaming instruction sequences $S_{M1}$, $S_{A1}$, $S_{B1}$, $S_{C1}$, $S_{D1}$, $S_{R1}$, $S_{M2}$, $S_{A2}$, . . . are then stored in that order in the FIFO areas prepared for the sequencers on the memory 26.

Figure 10:
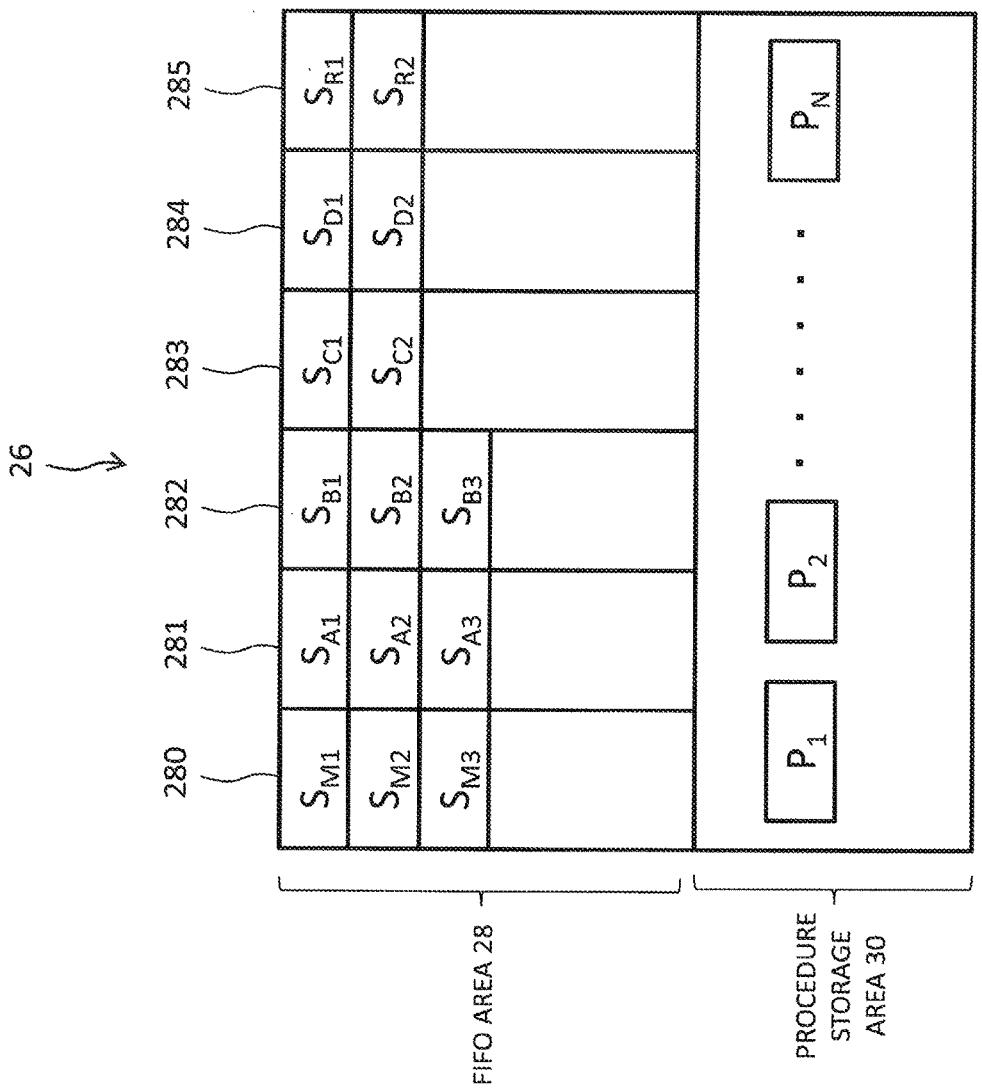
FIG. 10 is a diagram schematically showing a memory in which an instruction sequence is stored.

FIG. 10 shows the memory 26 in a state where the instruction sequences are stored. The procedure storage area 30 stores procedure instruction sequences $P_1$, $P_2$, . . . , $P_N$. On the other hand, the FIFO area 280 for the master sequencer 36 stores the streaming instruction sequences $S_{M1}$, $S_{M2}$, and $S_{M3}$ for the master sequencer 36. The FIFO area 281 for the first transmission sequencer 38 stores the streaming instruction sequences $S_{A1}$, $S_{A2}$, and $S_{A3}$ for the first transmission sequencer 38. The FIFO area 282 for the second sequencer 38 stores the streaming instruction sequences $S_{B1}$, $S_{B2}$, and $S_{B3}$ for the second transmission sequencer 38. The FIFO area 283 for the third transmission sequencer 38 stores the streaming instruction sequences $S_{C1}$ and $S_{C2}$ for the third transmission sequencer 38. The FIFO area 284 for the fourth transmission sequencer 38 stores the streaming instruction sequences $S_{D1}$ and $S_{D2}$ for the fourth transmission sequencer 38. The FIFO area 285 for the reception sequencer 40 stores the streaming instruction sequences $S_{R1}$ and $S_{R2}$ for the reception sequencer 40. Every time the streaming instruction sequence for each sequencer is generated and transferred, the transferred streaming instruction sequences are sequentially stored in the FIFO areas.

Figure 11:
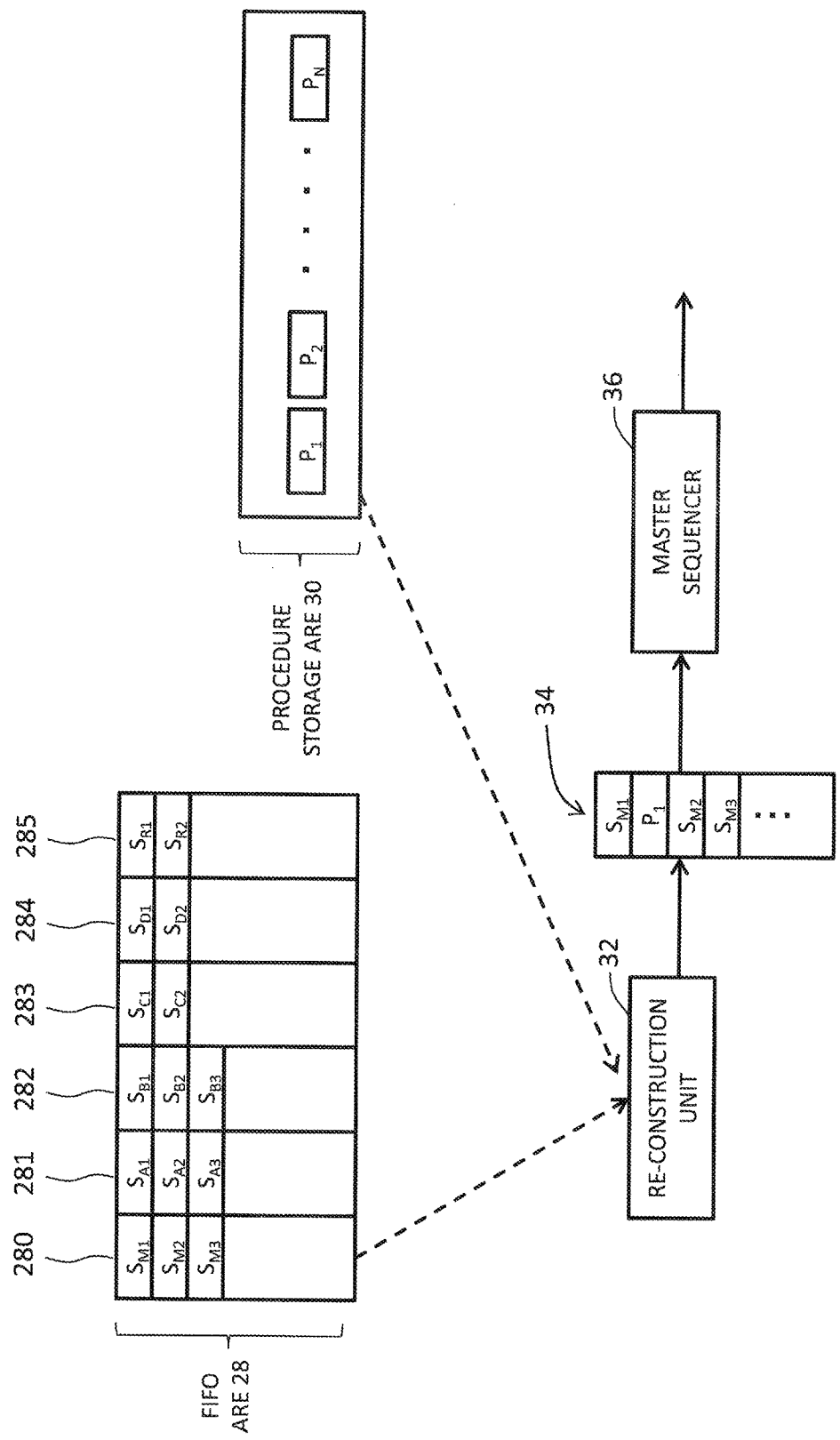
FIG. 11 is a diagram for explaining a re-construction process of an instruction sequence.

Next, details of the re-construction process of the instruction sequence will be described with reference to FIG. 11. When the streaming instruction sequence is stored in the memory 26, the re-construction unit 32 reads the streaming instruction sequences on the FIFO areas 280~285 from the beginning, and writes the read instruction sequence on the memory 34 for each sequencer (FIFO memory). Here, the re-construction process of the instruction sequence for the master sequencer 36 will be exemplified for description. The re-construction unit 32 reads the streaming instruction sequences on the FIFO area 280 from the beginning. In the example configuration shown in FIG. 11, the re-construction unit 32 reads the streaming instruction sequence $S_{M1}$ from the FIFO area 280, and writes the streaming instruction sequence $S_{M1}$ in the memory 34 for the master sequencer 36. When the address information indicating the storage location of the procedure instruction sequence is embedded in the streaming instruction sequence $S_{M1}$, the re-construction unit 32 refers to the procedure storage area 30 on the memory 26, and reads the procedure instruction sequence from the address indicated by the address information. Here, a case is considered in which the address information indicating the storage location of the procedure instruction sequence $P_1$ is embedded in the streaming instruction sequence $S_{M1}$. In this case, the re-construction unit 32 reads the procedure instruction sequence $P_1$ from the procedure storage area 30, interprets and decompresses the procedure instruction sequence $P_1$, and writes the instruction sequence on the memory 34. Subsequently, the re-construction unit 32 reads the next streaming instruction sequence $S_{M2}$ from the FIFO area 280, and writes the streaming instruction sequence $S_{M2}$ to the memory 34. When address information is embedded in the streaming instruction sequence $S_{M2}$, the re-construction unit 32 reads the procedure instruction sequence based on the address information. In the example configuration shown on FIG. 11, a configuration is considered in which no address information is embedded in the streaming instruction sequence $S_{M2}$. Subsequently, the re-construction unit 32 reads the next streaming instruction sequence $S_{M3}$ from the FIFO area 280, and writes the streaming instruction sequence $S_{M3}$ to the memory 34. The subsequent process is similar, and the re-construction unit 32 repeats the above-described process until the last streaming instruction sequence. With this process, the final instruction sequence is written to the memory 34. The processes for the transmission sequencer 38 and the reception sequencer 40 are similar, and the instruction sequences for the sequencers are written to the memories 34 for the sequencers. As described above, when a plurality of portions corresponding to the same procedure instruction sequence exist in the pulse program, one of the plurality of the procedure instruction sequences is stored in the procedure storage area 30. In this case, the procedure instruction sequence is used a plurality of times, to generate the instruction sequence for the portions that are made into procedures.

The unit of the instruction sequences written from the FIFO area 28 to the memory 34; that is, the unit of the instruction sequences to be re-constructed, may be the same as the unit of the streaming instruction sequences, or may be different. In the example configuration shown in FIG. 11, the unit of the instruction sequence to be re-constructed is the same as the unit of the streaming instruction sequence. The configuration is not limited to such a configuration, and the re-construction unit 32 may alternatively sequentially read the instruction sequence with a reading unit from the beginning of each of the FIFO areas 280~285, and write the read instruction sequence to the corresponding memory 34. The reading unit may be a unit which is determined in advance, or may be changed to an arbitrary unit.

When start of the measurement is instructed, the sequencers read the instructions from their own memories 34, and execute the read instructions. For example, the measurement may be started at a timing when one instruction sequence (for example, one streaming instruction sequence) is written to the memories 34 of all sequencers. Alternatively, the measurement may be started at a timing when a plurality of instruction sequences are written to the memories 34 of all sequencers. As already described with reference to FIG. 7, each sequencer sequentially reads the instructions from its own memory 34, and executes the read instructions.

In the present embodiment, while the re-constriction process is executed, each sequencer reads the instruction sequence from the memory 34 and executes the read instruction sequence from the point of time when the instruction for start of measurement is received. In addition, the generation and the transfer of the streaming instruction sequence are executed in parallel with the execution of the instruction sequence. Therefore, while the instruction sequences are executed by the sequencers, the streaming instruction sequences are sequentially generated by the instruction sequence generator 14, and are sequentially transferred by the transfer controller 16 to the FIFO area 28.

The amount of data of the streaming instruction sequence and the timing of start of measurement are determined such that the instruction sequence is not exhausted from the memory 34.

As described, in the present embodiment, a high density portion in the instruction sequence is made into a procedure, and is transferred in a precedential manner, and the other portions are transferred by ST transfer. By executing the ST transfer, it becomes possible to start the measurement earlier compared to a case where the instruction sequences are transferred to the transmission and reception unit 22 after all of the instruction sequences is generated. In addition, it becomes unnecessary to provide a large-capacity memory for storing all instruction sequences in the transmission and reception unit 22. On the other hand, if all of the instruction sequences are to be transferred by ST transfer, in a high density portion, the generation and transfer of the streaming instruction sequences cannot catch up with the consumption of the instruction sequences at the sequencer, resulting in a possible, problem that the instructions referred to by the sequencer are exhausted. In order to handle such a case, in the present embodiment, the high density portion is made into a procedure and transferred in a precedential manner. With such a configuration, it becomes possible to avoid exhaustion of the instruction sequence. In summary, by combining the precedential transfer and the ST transfer, it becomes possible to quicken the start of the NMR measurement, and, at the same time, avoid the exhaustion of the instruction sequences referred to by the sequencer. Moreover, it becomes unnecessary to provide a large-capacity memory in the transmission and reception unit 22, and the capacity of the memory can be reduced.

Furthermore, when a plurality of portions corresponding to the same procedure instruction sequence exist in the pulse program, one procedure instruction sequence of the plurality is transferred to the transmission and reception unit 22. The one procedure instruction sequence is used a plurality of times, to generate the instruction sequence of each portion which is made into a procedure. With such a configuration, a total amount of transfer of the instruction sequence is reduced, and the time required for completion of the precedential transfer can be reduced. In addition, because a total amount of transfer of the instruction sequence is reduced, the capacity of the memory can be reduced.

In the present embodiment, a plurality of sequencers are provided, but alternatively, the number of sequencers may be one. In this case also, the procedure instruction sequence executed by one sequencer is transferred in a precedential manner from the spectrometer control computer 12 to the transmission and reception unit 22, and, after the precedential transfer is completed, the streaming instruction sequences are sequentially transferred from the spectrometer control computer 12 to the transmission and reception unit 22. With such a configuration, advantages similar to those described above can be obtained.

The invention claimed is:

1. In a magnetic resonance measurement apparatus:
   a precedential processor unit (12) that identifies a procedure instruction sequence of a magnetic resonance measurement in a transmission/reception signals processing unit (22), and that executes a precedential process to transfer the identified procedure instruction sequence to a first storage unit (30) and to generate a streaming instruction sequence in which reference information for identifying a storage location of the procedure instruction sequence is embedded;
   a transfer unit (16) that sequentially transfers the streaming instruction sequence, after execution of the precedential process, to a second storage unit (28) in units of transfer from a beginning of the streaming instruction sequence;
   a re-construction unit (32) that re-constructs an instruction sequence for execution referring to the streaming instruction sequence, starting from the beginning, sequentially transferred to the second storage unit (28), the re-construction unit re-constructing the instruction sequence for execution by referring to the procedure instruction sequence on the first storage unit (30) based on the reference information embedded in the streaming instruction sequence; and
   a sequencer unit (36, 38, 40) that executes the re-constructed instruction sequence,
   wherein the re-construction unit (32) re-constructs the instruction sequence independent of processing of a nuclear magnetic resonance signal.

2. In the magnetic resonance measurement apparatus according to claim 1, wherein
   the sequencer unit includes a plurality of sequencers,
   the instruction sequence for execution is generated for each individual sequencer, and
   the same procedure entity included in a plurality of instruction sequences for execution for the plurality of sequencers is shared by the plurality of sequencers.

3. In the magnetic resonance measurement apparatus according to claim 1, wherein
   when the reference information includes portions corresponding to a plurality of procedure entities having the same content, the precedential processor unit transfers one of the plurality of procedure entities to the first storage unit.

4. In the magnetic resonance measurement apparatus according to claim 1, wherein
   the precedential processor unit has a function to identify a portion that satisfies a make-procedure condition in the procedure instruction sequence.

5. In the magnetic resonance measurement apparatus according to claim 4, wherein
   the portion that satisfies the make-procedure condition is a portion for realizing a specific pulse sequence.

6. In the magnetic resonance measurement apparatus according to claim 1, wherein
   the reference information is an address on the first storage unit or information that can identify the address.

7. In the magnetic resonance measurement apparatus according to claim 1, wherein
   the units of transfer are transferred as a streaming transfer, and the streaming transfer is executed in a parallel after start of execution of the instruction sequence by the sequencer unit.

8. In the magnetic resonance measurement apparatus according to claim 1, wherein
   the units of transfer are transferred as a streaming transfer, and generation of the streaming instruction sequence, transfer of the streaming instruction sequence, re-construction of the instruction sequence for execution, and execution of the instruction sequence for execution are executed in parallel to each other.

* * * * *